(12) United States Patent
Browning et al.

(10) Patent No.: US 9,930,798 B2
(45) Date of Patent: Mar. 27, 2018

(54) CLADDED METAL STRUCTURES

(71) Applicant: Apple Inc., Cupertino, CA (US)

(72) Inventors: Lucy E. Browning, San Francisco, CA (US); Joseph C. Poole, San Francisco, CA (US); Christopher D. Prest, San Francisco, CA (US); Stephen P. Zadesky, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/251,298

(22) Filed: Apr. 11, 2014

(65) Prior Publication Data

US 2014/0217864 A1 Aug. 7, 2014

Related U.S. Application Data

(62) Division of application No. 13/430,221, filed on Mar. 26, 2012, now Pat. No. 8,733,422.

(51) Int. Cl.
*B32B 15/00* (2006.01)
*H05K 5/04* (2006.01)
(Continued)

(52) U.S. Cl.
CPC ........... *H05K 5/04* (2013.01); *B23K 26/0861* (2013.01); *B23K 26/0884* (2013.01); *B23K 26/32* (2013.01); *B23K 26/34* (2013.01); *B23K 2201/36* (2013.01); *B23K 2203/02* (2013.01); *B23K 2203/04* (2013.01); *B23K 2203/05* (2015.10); *B23K 2203/08* (2013.01); *B23K 2203/10* (2013.01); *B23K 2203/14* (2013.01);
(Continued)

(58) Field of Classification Search
None
See application file for complete search history.

(56) References Cited

U.S. PATENT DOCUMENTS 2,893,931 A * 7/1959 Boyett .................... C25D 5/34
205/203
3,173,785 A * 3/1965 Manganello ............ C22C 32/00
419/10
(Continued)

FOREIGN PATENT DOCUMENTS

CN 1962919 * 5/2007 ............. C22C 45/08
CN 101158039 A 4/2008
(Continued)

OTHER PUBLICATIONS

Weast, Robert C., "Handbook of Chemistry and Physics", 1969, CRC, 50$^{th}$ Ed., F-18.*

(Continued)

*Primary Examiner* — Seth Dumbris
(74) *Attorney, Agent, or Firm* — Downey Brand LLP

(57) ABSTRACT

A metal enclosure has a surface region which is coated with cladding material using a laser cladding process. The metal enclosure can form at least a portion of an electronic device housing. All or part of one or more surfaces of the enclosure can be coated with cladding material. The coating of cladding material can be varied at selective regions of the enclosure to provide different structural properties at these regions. The coating of cladding material can be varied at selective regions to provide contrast in cosmetic appearance.

20 Claims, 7 Drawing Sheets

(51) Int. Cl.
  B23K 26/08 (2014.01)
  B23K 26/34 (2014.01)
  B23K 26/32 (2014.01)
  B23K 101/36 (2006.01)
  B23K 103/02 (2006.01)
  B23K 103/08 (2006.01)
  B23K 103/00 (2006.01)
  B23K 103/04 (2006.01)
  B23K 103/10 (2006.01)
  B23K 103/14 (2006.01)
  B23K 103/16 (2006.01)
  B23K 103/18 (2006.01)

(52) U.S. Cl.
  CPC ...... *B23K 2203/15* (2015.10); *B23K 2203/16* (2013.01); *B23K 2203/18* (2013.01); *B23K 2203/26* (2015.10); *B23K 2203/50* (2015.10); *Y10T 29/49982* (2015.01); *Y10T 29/49984* (2015.01)

(56) References Cited

U.S. PATENT DOCUMENTS

| | | | |
|---|---|---|---|
| 3,912,152 A * | 10/1975 | Forand, Jr. | B23K 20/2275 228/190 |
| 3,958,070 A * | 5/1976 | Schintlmeister | C23C 16/04 428/209 |
| RE29,815 E | 10/1978 | Gnanamuthu | |
| 4,354,301 A * | 10/1982 | Takeuchi | A44C 27/00 228/158 |
| 5,167,793 A * | 12/1992 | Jozefowicz | C25D 11/18 205/121 |
| 5,396,041 A * | 3/1995 | Miller | B23K 35/327 109/85 |
| 6,146,476 A | 11/2000 | Boyer | |
| 6,355,116 B1 | 3/2002 | Chen et al. | |
| 7,408,968 B2 | 8/2008 | Fukuhisa et al. | |
| 7,608,127 B2 * | 10/2009 | Lin | C22C 32/0052 75/240 |
| 7,967,570 B2 | 6/2011 | Shi et al. | |
| 8,398,841 B2 | 3/2013 | Khosla | |
| 8,733,422 B2 | 5/2014 | Browning et al. | |
| 8,828,553 B2 | 9/2014 | Khosla | |
| 2007/0099015 A1 | 5/2007 | Kamo et al. | |
| 2007/0163128 A1 | 7/2007 | Tarrerias | |
| 2009/0035448 A1 | 2/2009 | Flanagan et al. | |
| 2009/0190290 A1 * | 7/2009 | Lynch | H05K 5/0086 361/679.01 |
| 2009/0194308 A1 * | 8/2009 | Cheng | B32B 15/01 174/50 |
| 2009/0229666 A1 | 9/2009 | Corneille et al. | |
| 2010/0086702 A1 | 4/2010 | Blankenship et al. | |
| 2010/0143746 A1 | 6/2010 | Song et al. | |
| 2010/0173172 A1 | 7/2010 | Killian et al. | |
| 2011/0048754 A1 * | 3/2011 | Xiong | C23C 26/00 174/50 |
| 2011/0159138 A1 | 6/2011 | Paget et al. | |
| 2013/0153429 A1 | 6/2013 | Khosla | |

FOREIGN PATENT DOCUMENTS

| | | | |
|---|---|---|---|
| JP | H08502319 A | 3/1996 | |
| KR | 20040009306 A | 1/2004 | |
| KR | 20110105391 A | 9/2011 | |
| TW | I231830 | 5/2005 | |
| WO | WO9408073 A1 | 4/1994 | |
| WO | WO2005089995 A1 | 9/2005 | |
| WO | WO2009079745 | * 7/2009 | ............... C25D 5/18 |

OTHER PUBLICATIONS

Korean Patent Application No. 10-2014-7029857—Notice of Preliminary Rejection dated Oct. 23, 2015.
Chinese Application for Invention No. 201380016683.3—First Office Action dated Nov. 4, 2015.
Taiwanese Patent Application No. 102110535—Office Action dated Jul. 17, 2015.
PCT/US2013/033378. Int'l Search Report & Written Opinion (dated Jul. 9, 2013).
Chinese Application No. 201380016683.3 Second Office Action and Search Report dated Jun. 29, 2016.
Chinese Patent Application No. 201380016683.3—Office Action dated Jun. 29, 2016.

* cited by examiner

CLADDED METAL STRUCTURES

CROSS-REFERENCE TO RELATED APPLICATIONS

This is a divisional of U.S. application Ser. No. 13/430,221 filed Mar. 26, 2012 entitled LASER CLADDING SURFACE TREATMENTS, which is incorporated herein by reference in its entirety.

FIELD

The present invention relates to treatments for a surface of a metal article and an article with a treated surface. More particularly, the present invention relates to performing laser cladding treatments to coat all or part of one or more surfaces of a metal enclosure with cladding material, and farther relates to a metal enclosure with different coatings of cladding material on selective regions to provide different structural and/or cosmetic properties at these regions of the metal enclosure.

BACKGROUND

Many products in the commercial and consumer industries are metal articles, or include metal enclosures. The metal surfaces of these products may be treated by any number of processes to alter the surface to create a desired effect, either functional (such as corrosion resistance and wear resistance), cosmetic (such as color, shininess or surface texture), or both. Such characteristics are important to consumers because they want to purchase products that have surfaces that will stand up to normal wear and tear of everyday use and continue to look brand new. One example of such a surface treatment is anodization. Anodizing a metal surface converts a portion of the metal surface into a metal oxide, thereby creating a metal oxide layer. The porous nature of the metal oxide layer created by anodization can be used for absorbing dyes to impart a color to the anodized metal surface. While anodized metal surfaces can provide increased corrosion resistance and wear resistance, it can be difficult for a metal oxide layer to form at edges, such as at corners of the metal article. The metal oxide grows vertically into and outward from a surface, and these growing surfaces intersect at a corner such that the corner itself does not have metal oxide growth.

SUMMARY

In broad terms, a metal enclosure can be surface treated using a laser cladding process to create a cladding layer on a surface region of the enclosure. The cladding layer can have one or more structural properties chosen from corrosion resistance, hardness, and fracture toughness that are greater than corresponding structural properties of the underlying metal substrate. The cladding layer can have a cosmetic property such as color, shininess and/or texture, that is different from a corresponding cosmetic property of the underlying metal substrate. The metal enclosure can form all or part of an electronic device housing.

The metal enclosure can include a second surface region having a cladding layer. The cladding layers on the first and second surface regions can have different properties. For example, the cladding layers can have different structural properties, such as different corrosion resistance, hardness, and/or fracture toughness. The cladding layers can have different thicknesses. The cladding layers can have different appearances, such as different colors, shininess and/or texture. The cladding layers on the first and second surface regions can have different compositions, which can achieve the difference in structural properties or appearance between the cladding layers. The metal enclosure can be surface treated to create an anodized layer on one surface region and a cladding layer on another surface region using respective anodization and laser cladding processes. The metal enclosure can have non-anodized corners adjacent the anodized layer, and the corners can be coated with the cladding layer.

BRIEF DESCRIPTION OF THE DRAWINGS

The accompanying drawings, which are incorporated herein and form a part of the specification, illustrate the present invention by way of example, and not by way of limitation. The drawings together with the description, further serve to explain the principles of the invention and to enable a person skilled in the pertinent art to make and use the invention.

DETAILED DESCRIPTION

Figure 1:
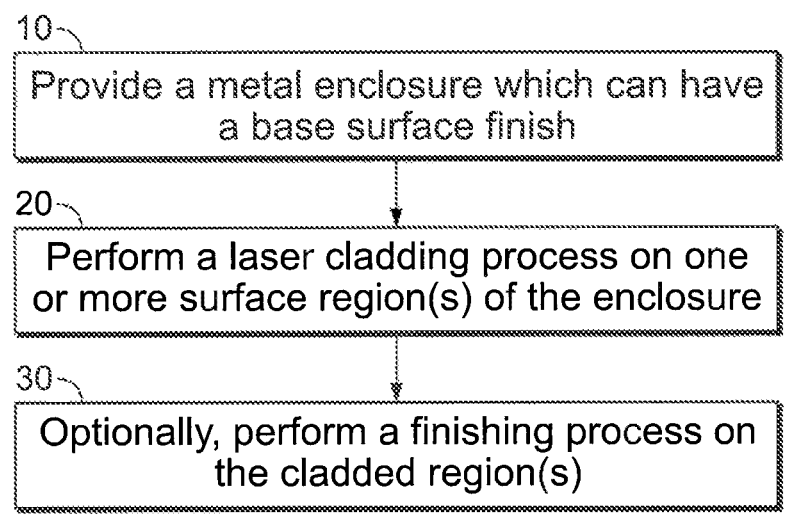
FIG. 1 is a flowchart of an exemplary method for surface treating a metal enclosure to obtain a surface region that is laser clad, in accordance with one embodiment of the present application.

The present invention will be described with reference to the accompanying drawings, in which like reference numerals refer to similar elements. While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

In embodiments presented herein, a metal enclosure is surface treated using a laser cladding process to create a cladding layer on a surface region of the enclosure. The cladding layer can be more durable or cosmetically appealing than the underlying metal substrate and provide the enclosure with a more durable and/or attractive surface. For example, in some embodiments, the cladding layer can have a structural property chosen from corrosion resistance, hardness, and fracture toughness that is greater than a corresponding structural property of the underlying metal substrate. The cladding layer can have a cosmetic property such as color, shininess and/or texture, that is different from that of the underlying metal substrate.

As known to one of skill in the art, a laser cladding process is a hard coating technique in which a cladding material with the desired properties is fused onto a metal substrate by means of a laser beam, resulting in a metallurgical bond between the cladding material and the metal substrate. Laser cladding can yield a cladding layer formed of the cladding material that can have superior properties in terms of pureness, homogeneity, hardness, bonding and microstructure, as compared to other hard coating techniques. The laser beam can be controlled to provide focused heating and localized melting of the substrate and the cladding material. Compared to conventional welding, laser cladding can provide minimal dilution and a small heat affected zone where the substrate and the cladding material melt and minimally mix together to achieve the metallurgical bond. A high degree of mixing between the cladding material and the substrate, which can deteriorate the properties of the resulting cladding layer, can be avoided using a laser cladding process. In some embodiments presented herein, a laser cladding process is used to clad a surface region of a metal enclosure. In some embodiments, laser cladding can be used to form the metal enclosure itself, in which the enclosure is manufactured as a near-net-shape part using a laser cladding process.

A laser cladding process can be automated and can be controlled to precisely coat a selective surface region of the metal enclosure with a cladding layer. The thickness of the cladding layer can be selected depending on the target structural properties and/or cosmetic properties (e.g., color, shininess and/or texture). The laser cladding process can control the deposition of the cladding layer to achieve a desired thickness varying between several micrometers to several centimeters. For example, in some embodiments, a laser cladding process is used to apply a cladding layer having a thickness in a range of from about 50 mm to about 2 mm, or a thickness of from about 0.1 mm to about 0.5 mm in other embodiments. Exemplary deposition rates can involve several square-cm per minute for cladding layers with a thickness of around 1 mm.

A wide selection of homologous and non-homologous powder materials can be used as the cladding material, and the materials can be selected depending on the target structural properties and/or cosmetic properties. In some embodiments, the cladding material can include a ceramic and a metal. For example, the cladding material can include ceramic particles (e.g., titanium carbide, tungsten carbide) suspended in a metal matrix (e.g., stainless steel and other steel alloys, as well as aluminum, nickel, cobalt, magnesium, titanium and alloys thereof). In some embodiments, the matrix metal is selected to be the same metal which forms the metal substrate. The homogeneity of the cladding metal matrix and the metal substrate can improve the metallurgical bond. The ratio of ceramic to metal can be selected depending on the target structural properties and/or cosmetic properties. For example, increasing the loading of the ceramic particles in a metal matrix can achieve a harder, more brittle cladding layer. Decreasing the loading of the ceramic particles in the metal matrix can achieve a cladding layer that is less brittle (i.e., lower fracture toughness) and has a lower hardness. A harder cladding layer can be more resistant to abrasions, scratches and other wear, and a less brittle cladding layer can be more resistant to fracturing when subject to impact forces during use of the metal enclosure. In some embodiments, the material of cladding layer includes hard, brittle particles (e.g., carbides) in a ductile metal matrix that improves the cladding material's resistance to fracture. The ratio of ceramic particles to matrix material can be selected to achieve a desired balance of both hardness and fracture toughness properties.

In some embodiments, the volume percent of ceramic particles in the cladding material does not exceed about 60 vol %, does not exceed about 50 vol %, or is from about 40 vol % to about 50 vol %. In some embodiments, the powder materials of the cladding material can be mixed with a binder to form agglomerated powder or to form a paste, to facilitate application of the cladding material to the metal substrate during the laser cladding process.

The cladding materials can be selected depending on the target cosmetic properties. For example, the color of the cladding layer can also be modified by changing the composition of the metal matrix and/or the ratio of ceramic particles to metal matrix. For example, in some embodiments, the different colors achieved by varying the cladding material composition appear as different shades of grey. In some embodiments, a glass matrix is used in the cladding material, which can render the cladding layer translucent or transparent and the color of the underlying metal substrate can show through the cladding layer. The cosmetic properties of the cladding layer can also be varied by adjusting the size and/or shape of the particles in the matrix, which can affect the texture.

The metal substrate of the metal enclosure can be any suitable metal for forming metal enclosures (e.g., stainless steel and other steel alloys, as well as aluminum, nickel, cobalt, magnesium, titanium and alloys thereof). The metal enclosure can be formed using any metalworking process (e.g., extrusion, cast, forging, machining, metal injection molding (MIMS) processes).

As an example, a method to achieve a laser clad metal enclosure according to some embodiments presented herein, a metal enclosure can be forged, with any additional structural details thereafter machined (such as machining to provide grooves or holes or to refine the profile of the enclosure using, e.g., computer numerical controls (CNC)). Then, all or part of one or more surfaces of the metal enclosure can be laser clad with a cladding material. For example, in some embodiments, all or part of the exterior surface of the metal enclosure is laser clad. In some embodiments, the entire exterior surface of a metal enclosure is laser clad. Following the laser cladding process, any additional structural details can be machined into the laser clad surface. In some embodiments, the metal enclosure forms all or part of an electronic device housing. The laser clad surface can be provided on the exterior surface of the metal enclosure to constitute an outer, exposed surface of the device.

The metal enclosure can be provided with an initial base surface finish prior to performing the laser cladding process, and a finish can be provided on the cladding layer after performing the laser cladding process. For example, a finishing process such as blasting can be performed on the surface region of the metal substrate prior to being laser clad, and a finishing process such as polishing can be performed on the resulting cladding layer. Any mechanical or chemical finishing processes known to one of skill in the relevant arts can be performed on the metal substrate or the cladding layer. Non-limiting examples of mechanical finishing processes include polishing (e.g., lapping or buffing), blasting (e.g., grit or sand blasting), and mass finishing methods such as sanding, tumbling, brushing, and any combination thereof. Non-limiting examples of chemical finishing processes include electropolishing and chemical polishing, such as bright dipping. Moreover, finishing of a cladding layer on a surface region can include application of a top coating, such as a powder coating, clear coating, lacquer or other cosmetic finishing layer. In some embodiments, finishing of a cladding layer on a surface region can also include a removal process (e.g., machining) for leveling the cladding layer relative to adjacent surface layers (see, e.g., steps 30 and 50 of the embodiments illustrated in later-described FIGS. 2-4 and 10).

A laser cladding process can involve a 1-stage or a 2-stage process, as known to one of skill in the relevant arts. In a 1-stage process, the cladding material is applied during application of the laser beam (e.g., as a powder or wire fed alongside the laser beam). The powder can be injected onto the substrate by either coaxial or lateral nozzles relative to the laser's position as known in the art. In a 2-stage process, the cladding material is preplaced on the substrate surface (e.g., as preplaced powder, paste/binder mix, plate, wire, through plasma spraying or flame spraying). The cladding material is then melted onto the substrate using a laser beam. In some embodiments, preplacement of cladding material on multiple surfaces of a 3-D enclosure can achieved by using a mold within which the preform is adhered to the metal enclosure (see, e.g., laser cladding steps of later-described FIG. 9). The metal enclosure is then removed with the cladding material being preplaced on the desired surface regions of the enclosure. The laser beam can then be applied to bond the preplaced cladding material to the enclosure at the desired surface regions.

As known in the art, the laser beam causes a melt pool to form in the beam's path. Removal of the beam from the melt pool allows the pool to solidify and produce a track of a solid clad layer following the beam's path. Thereafter, if desired, another clad layer can be deposited on top of the first clad layer to achieve a desired thickness or property of the final cladding layer. Either the laser beam or the substrate can be kept stationary while the other of the substrate or the laser beam is controlled to move in the x,y,z, directions so that the beam tracks along the surface of the substrate, locally melting the cladding material in the beam's path to bond the cladding material onto the substrate. In some embodiments, the metal substrate can be preheated before laser cladding, in order to reduce the cooling rates in the cladding layer and minimize or prevent cracking of the layer on cooling.

The resulting cladding layer on the metal enclosure can be one or more stacked clad layers. In some embodiments, the cladding layer is one clad layer, and in some embodiments, the clad layer is a plurality of clad layers. In cases where multiple clad layers form a cladding layer, the number of clad layers is optimized to a minimum amount, because the bond between adjacent clad layers can fail and adversely affect the mechanical properties of the cladding layer.

The flowcharts and illustrations of FIGS. 1-15 will now be described to further illustrate exemplary methods and laser clad metal enclosures according to embodiments presented herein. It should be understood that any features of an embodiment disclosed herein can be combined with any features of any other embodiment disclosed herein, without departing from the scope of the present disclosure. Thus, any of the features of the methods and metal enclosures described above can be combined with any features of the methods and metal enclosures described below with reference to FIGS. 1-15.

FIG. 1 is a high level flowchart of an exemplary method for surface treating a metal enclosure to obtain a surface region that is laser clad. The method includes a step 10 of providing a metal enclosure (which, in some embodiments, can be provided with a base finish as described above), followed by a step 20 and an optional step 30. In step 20, a laser cladding is performed on one or more region(s) of the metal enclosure. Optionally, step 20 can be followed by step 30 of performing a finishing process on the cladded region(s).

Figure 2:
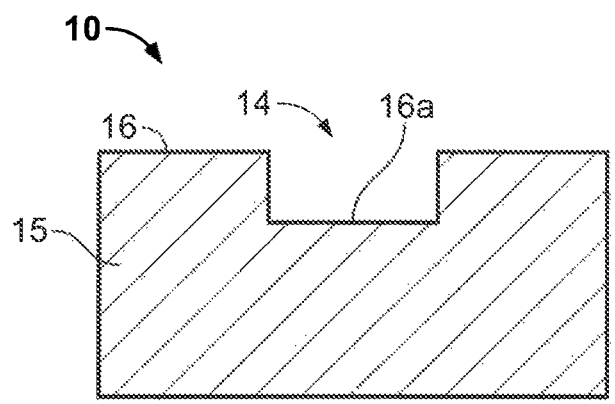
FIGS. 2-4 are enlarged cross-sectional side views of a metal enclosure at different stages in the method of FIG. 1, in accordance with one embodiment of the present application.
Figure 3:
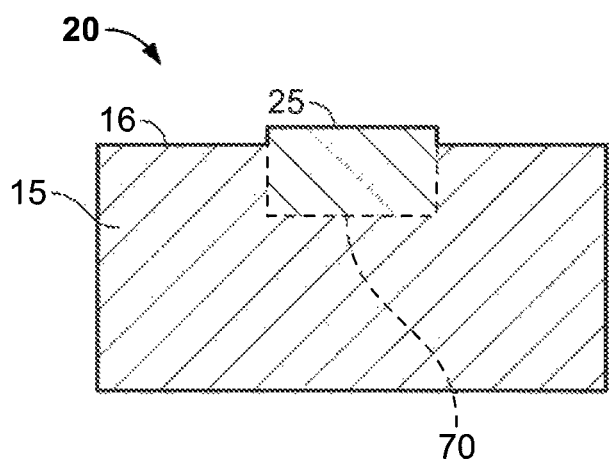
Figure 4:
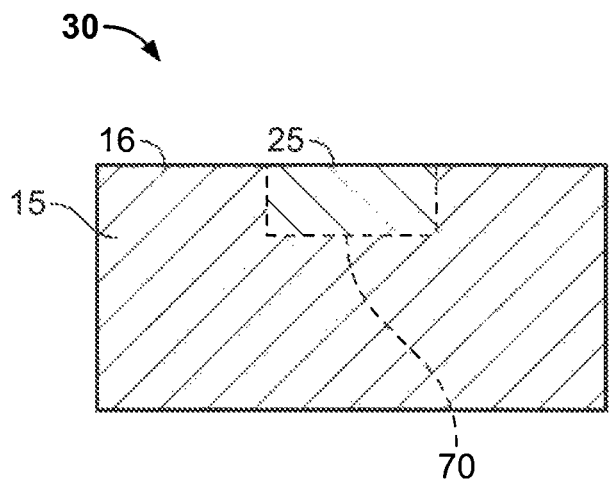

In some embodiments, the laser cladding process is used to deposit inlays of the cladding material. For example, the surface region to be laser clad is a groove in a surface of the metal enclosure. Laser cladding the groove inlays the cladding material in the groove. The resulting cladding layer in the groove can be subjected to a finishing process that removes any excess cladding so that the cladding layer is substantially flush with the adjacent surface of the enclosure. FIGS. 2-4 are enlarged cross-sectional side views of a metal enclosure at different stages in the method of FIG. 1, in which the cladding material is inlaid on the metal enclosure according to one embodiment presented herein. As illustrated in FIG. 2, in step 10, a metal enclosure 15 is provided. Metal enclosure 15 has a surface 16 including an area forming a surface region 16a. Surface region 16a is a groove 14 in surface 16. In step 20 illustrated in FIG. 3, a laser cladding process is performed to coat surface region 16a with a cladding layer 25 so as to fill groove 14 with cladding material. A metallurgical bond 70 is formed between cladding layer 25 and the underlying metal of surface region 16a. Following the cladding process, excess cladding material of layer 25 may extend out of groove 14, above surface 16 of enclosure 15. In step 30 illustrated in FIG. 4, cladding layer 25 is subjected to a finishing process to remove this excess cladding material. The finished surface of cladding layer 25 is substantially flush with adjacent surface 16 of the enclosure 15, and cladding layer 25 has a thickness corresponding to the depth of groove 14. FIGS. 2-4 are merely exemplary and provided for explanatory purposes of the methods described herein, and other variations of treating metal enclosure 15, to include a cladded region formed by cladding layer 25 are described in the embodiments that follow and should be apparent to one of skill in the art.

In some embodiments, metal enclosure can include one or more additional surface regions coated with one or more cladding layers that each have different properties. For example, in some embodiments, the metal enclosure can include a second surface region having a second cladding layer. The cladding layers on the first and second surface regions can have different properties (e.g., different structure and/or cosmetic properties). In some embodiments, the cladding layers on the first and second surface regions can have different compositions, which can achieve the difference in structural properties or appearance between the cladding layers. For example, the compositions of the cladding layers can include a ceramic and a metal, and the ratio of ceramic to metal can vary between cladding layers at different surface regions. In some embodiments, the cladding layers on the first and second surface regions can have different thicknesses. A surface region that may be exposed to a higher likelihood of receiving impact during user-handling of the metal enclosure may have a cladding layer with a greater fracture resistance as compared with a cladding layer on another surface region without the same likelihood of impact exposure. A surface region that may be exposed to a higher likelihood of receiving scratches or abrasions during use of the metal enclosure may have a cladding layer which provides a greater hardness as compared with a cladding layer on another surface region without the same likelihood of such exposure.

Figure 5:
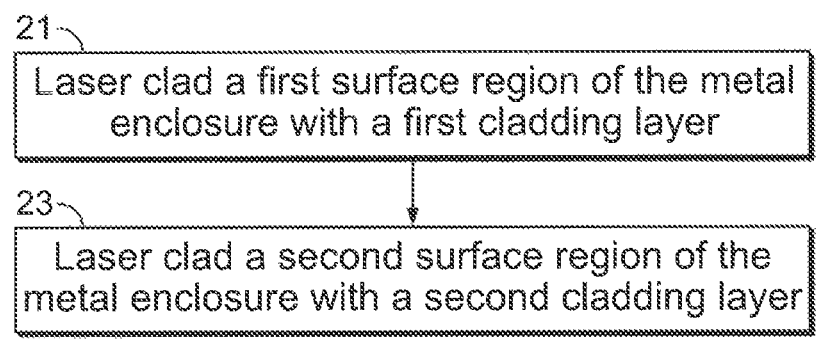
FIG. 5 is a flowchart of exemplary substeps for performing the laser cladding step of the method of FIG. 1, in accordance with one embodiment of the present application.
Figure 6:
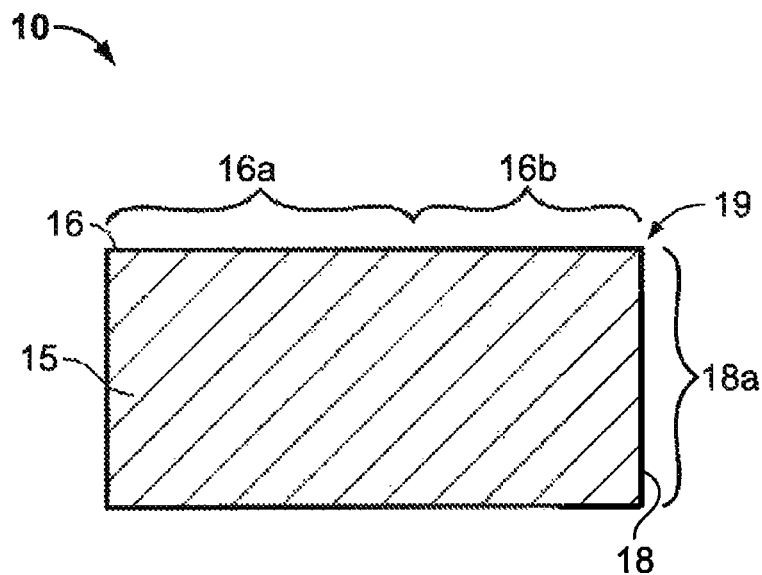
FIGS. 6-8 are enlarged cross-sectional side views of a metal enclosure at different stages in performing the laser cladding substeps of FIG. 5, in accordance with one embodiment of the present application.
Figure 7:
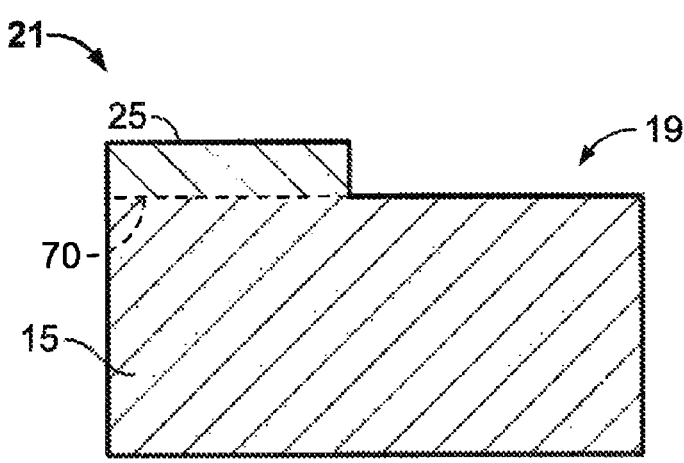
Figure 8:
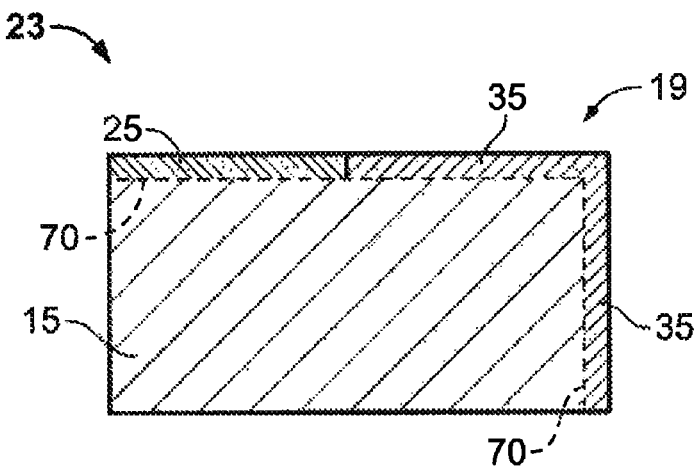

FIG. 5 is a high-level flowchart of exemplary substeps 21 and 23 of step 20 for performing the laser cladding process to achieve different surface regions clad with cladding layers having different properties. In step 21, a first surface region of the metal enclosure is laser clad with a first cladding layer, and in step 23, a second surface region of the metal enclosure is laser clad with a second cladding layer. FIGS. 6-8 are enlarged cross-sectional side views of metal enclosure 15 illustrating substeps 21 and 23. In the embodiment of step 10 shown, metal enclosure 15 is provided, in which surface 16 of metal enclosure 15 includes first and second surface regions 16a and 16b. Metal enclosure 15 has a different surface 18 having a surface region 18a. Surfaces 16 and 18 are immediately adjacent to each other, with surface regions 16b and 18a meeting at a shared edge, at corner 19. In step 21 illustrated in FIG. 7, first cladding layer 25 is coated on first surface region 16a using a laser cladding process. In step 23 illustrated in FIG. 8, a second cladding layer 35 is coated on either second surface region 16b, surface region 18a, or both of these regions, using a laser cladding process. As illustrated in FIG. 8, both surface regions 16b and 18a are laser clad with a second cladding layer 35. Metallurgical bond 70 is formed between cladding layers 25 and 35 and the underlying metal of surfaces 16 and 18.

Cladding layers 25 and 35 may have different properties (e.g., structural and/or cosmetic properties such as earlier described). In some embodiments, cladding layers 25 and 35 are formed of the same cladding material (with the same composition) but with different thicknesses, which result in differences in properties between layers 25 and 35. In some embodiments, cladding layers 25 and 35 are formed of different cladding materials (with different compositions). The cladding layers 25 and 35 (with different compositions) can further differ in thickness. In some embodiments, the cladding material compositions of cladding layers 25 and 35 differ in type and/or amount of components. For cladding materials including particles (e.g., ceramic particles) suspended in a matrix material (e.g., a metal matrix), the type of matrix material or the type of particles may differ between compositions of cladding layers 25 and 35. The compositions of cladding layers 25 and 35 can further differ in the relative ratio (e.g., volume ratio) of particles to matrix material.

In some embodiments, the cladding materials of cladding layers 25 and 35 can each comprise the same ceramic and metal matrix, with the difference in compositions being a difference in a volume percent of ceramic particles in each cladding layer. As an example only and not by way of limitation, a volume percent of the ceramic particles in first cladding layer 25 can be greater than a volume percent of the ceramic particles in second cladding layer 35, or vice versa. In some embodiments, this difference in properties of cladding layers 25 and 35 can be achieved by varying the composition of the cladding materials forming cladding layers 25 and 35. For example, the composition of cladding layer 35 can have a lower volume percent of hard ceramic particles (relative to that of cladding layer 25) to improve fracture toughness, and the composition of cladding layer 25 can have a higher volume percent of hard ceramic particles to improve hardness. In the embodiment of FIG. 8, cladding layer 35 coats corner 19 of metal enclosure 15. Corner 19 may have a higher likelihood of receiving impact forces during user-handling of metal enclosure 15 than surface region 16a. For example, a hand-held electronic device can include metal enclosure 15 having cladding layers 25 and 35 on its exterior surfaces (see, e.g., device 100 of later-described FIG. 15). If the device is dropped to the ground, corner 19 can be a likely site of impact with the ground. Surface region 16a may have a higher likelihood of receiving scratches or abrasions during use of metal enclosure 15 than surface regions 16b and 18a at corner 19. In such instances, it may be desirable for cladding layer 35 to have a greater fracture toughness than that of cladding layer 25, and for cladding layer 25 to have a greater hardness than that of cladding layer 35.

FIGS. 6-8 are merely exemplary and provided for explanatory purposes of the methods described herein, and other variations of treating metal enclosure 15, to include two cladded regions formed by respective cladding layers 25 and 35 are described in the embodiments that follow and should be apparent to one of skill in the art. It should also be apparent that the more than two cladding layers can laser clad respective surface regions of metal enclosure 15.

Use of a 1-stage or a 2-stage laser cladding process can be employed for coating metal enclosure 15 with cladding layers 25 and 35. In some embodiments, cladding layers 25 and 35 are sequentially coated on surface regions that are immediately adjacent to each other (e.g., regions 16 and 16b or regions 16b and 18a) and abut each other. In such embodiments, a suitable masking material can be used to mask one cladding layer (e.g., layer 25) on enclosure 15 while the other cladding layer (e.g., layer 35) is deposited via the laser cladding process. The masking can be used to provide additional precision to depositing cladding layers 25 and 35 at the boundary where they meet. In some embodiments, the cladding materials can be deposited with the desired precision by virtue of the focus of the laser beam, and masking is unnecessary.

Figure 9:
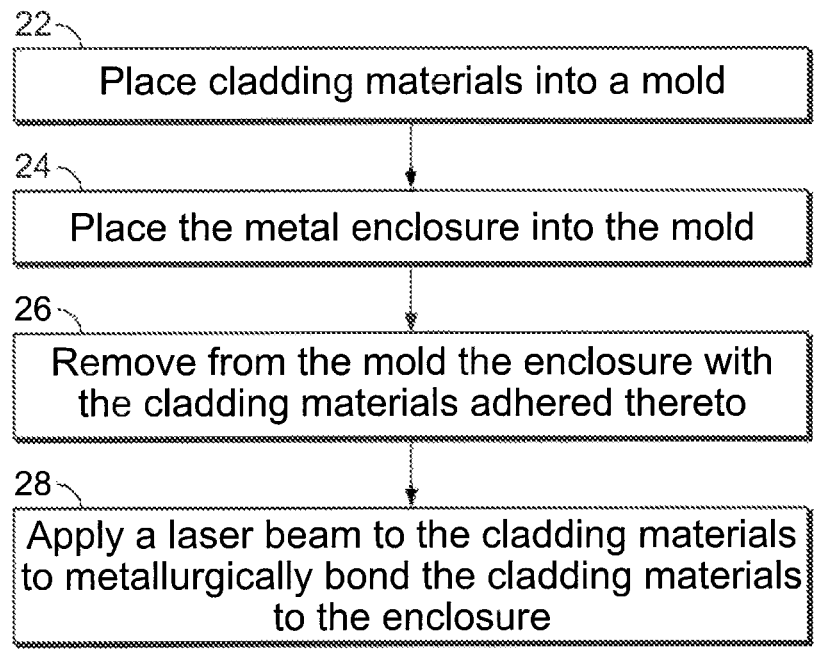
FIG. 9 is a flowchart of exemplary substeps for performing the laser cladding step of the method of FIG. 1, in accordance with one embodiment of the present invention.

In some embodiments employing a 2-stage process, a mold can be used to preplace the cladding materials (e.g., cladding materials of layers 2.5 and 35) on a 3-D substrate (erg., on surfaces 16 and 18 of metal enclosure 15) prior to application of the laser beam. FIG. 9 is a high-level flowchart of exemplary substeps 22, 24, 26 and 28 of step 20 for performing a 2-stage laser cladding process using a mold. As an exemplary embodiment, reference will be made to cladding layers 25 and 35 shown in FIG. 8 when describing the substeps of FIG. 9. In step 22, the cladding materials are placed in a mold to form a cladding preform, and in step 24, metal enclosure 15 is placed into the mold. Placement of the cladding materials in the mold (step 22) can occur before or after placement of metal enclosure 15 in the mold (step 24). The cladding preform can line the interior of the mold so that surface region 16a of enclosure 15 in the mold faces the cladding materials corresponding to cladding layer 25, and so that surface regions 16b and 18a of enclosure 15 face the cladding materials corresponding to cladding layers 35. In the mold, the materials of first and second cladding layers 25 and 35 are adhered to the respective surface regions 16a, 16b, and 18a. Any suitable mechanism can be used to adhere the preform of cladding materials to the surfaces of metal enclosure 15. For example, in some embodiments, an adhesive is used to adhere the cladding preform to enclosure 15. In step 26, metal enclosure 15 is removed from the mold. Metal enclosure 15 has the cladding preform adhered thereto. In step 28, a laser beam is applied to the cladding preform to metallurgically bond (see, e.g., metallurgical bond 70, FIG. 8) the cladding materials to surface regions 16a, 16b, and 18a to create respective cladding layers 25 and 35.

It should be understood that the foregoing reference to coating enclosure 15 with two cladding layers 25 and 35 of FIG. 8 is merely exemplary and provided for explanatory purposes of the substeps of FIG. 9, and other variations should be apparent to one of skill in the art. For example, in some embodiments, the substeps of FIG. 9 can be employed to laser clad all or part of a 3-D metal enclosure with one cladding layer (e.g., either one of layers 25 or 35) or for laser cladding all or part of a 3-D metal enclosure with more than two cladding layers.

Figure 10:
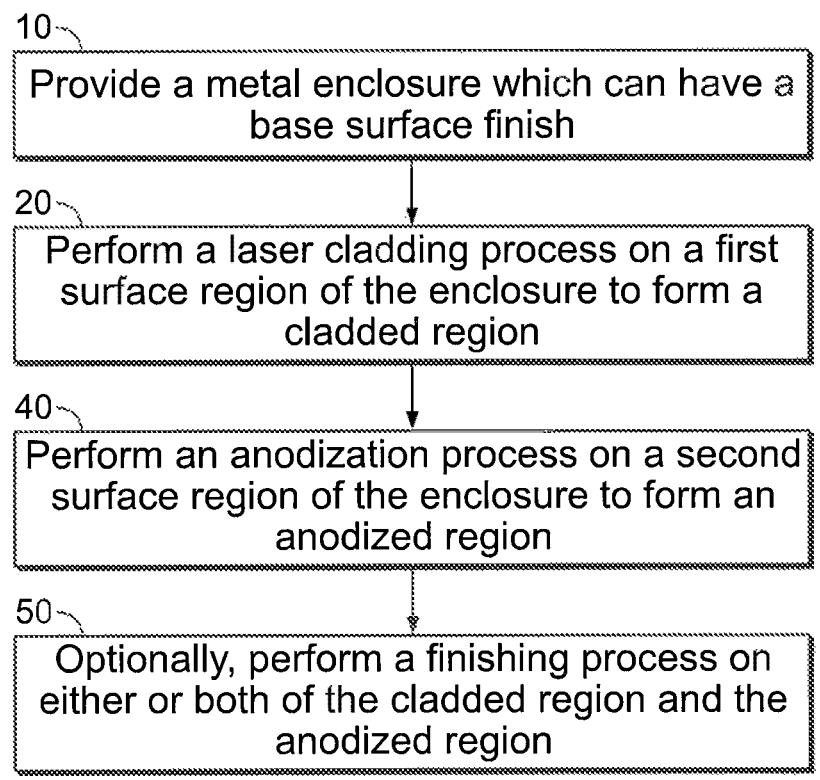
FIG. 10 a flowchart of an exemplary method for surface treating a metal enclosure to obtain a surface region that is anodized and another surface region that is laser clad, in accordance with one embodiment of the present application.
Figure 11:
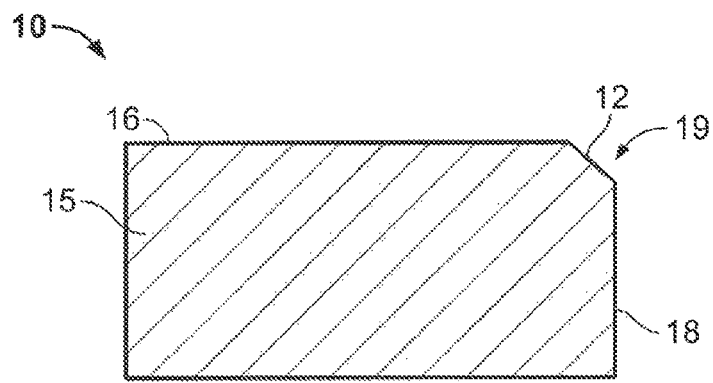
FIGS. 11-14 are enlarged cross-sectional side views of a metal enclosure at different stages in the method of FIG. 10, in accordance with one embodiment of the present application.
Figure 12:
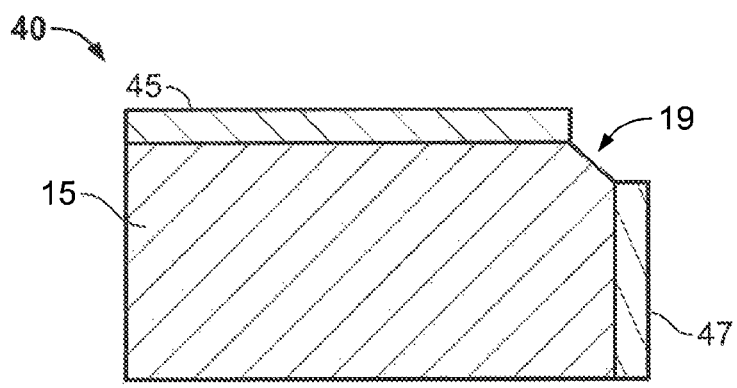
Figure 13:
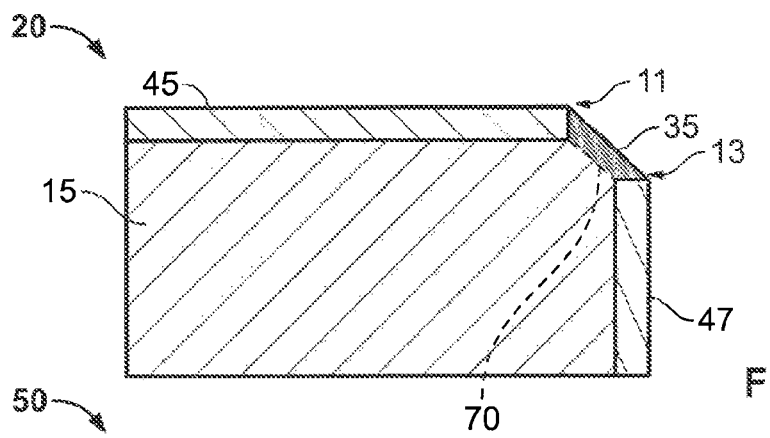
Figure 14:
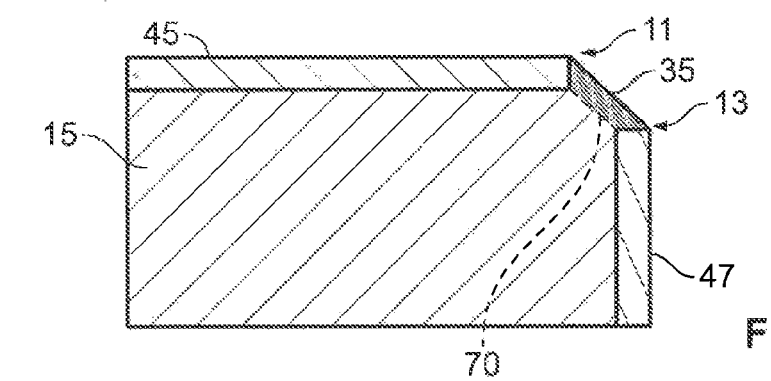

In some embodiments, the metal enclosure can be surface treated to create an anodized layer on one surface region and a cladding layer on another surface region using respective anodization and laser cladding processes. The metal enclosure can have non-anodized corners adjacent the anodized layer, and the corners can be coated with the cladding layer. Thus, surfaces (such as corners) where it may be difficult for a metal oxide layer to form an anodized layer can instead be laser clad. FIG. 10 is a high level flowchart of an exemplary method for surface treating a metal enclosure to obtain a surface region that is laser clad and another surface region that is anodized. The method includes a step 10 of providing a metal enclosure (which, in some embodiments, can be provided with a base finish as described above), followed by a cladding step 20 and an anodizing step 40 (in either order), and an optional step 50. In cladding step 20, a laser cladding process is performed on a first surface region of the metal enclosure to form a cladded region. In anodizing step 40, an anodization process is performed on a second surface region of the metal enclosure to form an anodized region. Optionally, cladding step 20 and anodizing step 40 can be followed by step 50 of performing a finishing process on either or both of the cladded region and the anodized region. Any suitable finishing processes known to one of skill the art can be used for cladded region and the anodized region. For the anodized region, finishing processes can include dyeing and/or sealing the anodized region as known in the art. After dyeing and/or sealing, additional finishing steps (e.g., polishing or texturing) may be performed, including any of the mechanical and chemical finishing processes described earlier with reference to finishing the base metal of the enclosure and the cladding layer.

As earlier described, the laser cladding process can be any of one or more laser cladding surface treatments as known to one of skill in the art. The anodization process can be any of one or more anodization surface treatments as known to one of skill in the art. Such anodization surface treatments can include standard and hard anodization methods, for example. Standard anodizing and hard anodizing are terms of art. Standard anodizing refers to an anodization process using a sulfuric acid bath that is able to produce an oxide layer of up to about 25 microns (pm). Hard anodizing refers to an anodization process using a sulfuric acid bath maintained at about or slightly above the freezing point of water, for example in a range between about 0 and 5 degrees Celsius, to produce an oxide layer of up to about 100 microns. Standard anodized layers are generally a brighter color than hard anodized layers when dyed with the same solution, and when neither is dyed. Hard anodized layers, as the name connotes, are harder than standard anodized layers and therefore are more scratch and abrasion resistant. In some embodiments, a dual anodization treatment can be used to form anodized layer 25, whereby anodized layer 25 includes both standard and hard anodized layers and/or regions, such as described in detail in U.S. Pat. No. 8,398,841, which is incorporated herein in its entirety by reference thereto.

In some embodiments, cladding step 20 includes the substeps of FIG. 5, whereby the cladded region includes regions with different cladding layers which can have different properties. In some embodiments, cladding step 20 includes the substeps of FIG. 9, in which a 2-stage cladding process using a mold is employed to laser clad the first surface region. Cladding step 20 can be conducted before or after anodizing step 40. In some embodiments, a suitable masking material can be used to mask one of the first and second surface regions while operations are performed on the other of the second and first surface regions. For example, cladding step 20 can be conducted prior to anodizing step 40. The second surface region can be masked while the first surface region is clad. The masking on the second surface region can be removed, and the cladded region can then be masked. Masking can protect the cladded region from undesired effects of the subsequent anodization process. The second surface region can then be anodized, whereafter the masking on the cladded region can be removed. In some embodiments, the cladding materials can be deposited with the desired precision by virtue of the focus of the laser beam, and masking of the second surface region is unnecessary.

As another example, anodizing step 40 can be conducted prior to cladding step 20. The first surface region can be masked while the second surface region is anodized. The masking on the first surface region can be removed, and the anodized region can then be masked. The first surface region can then be laser clad, whereafter the masking on the anodized region can be removed. In some embodiments, the cladding materials can be deposited with the desired precision by virtue of the focus of the laser beam, and masking of the anodized region is unnecessary.

FIGS. 11-14 are enlarged cross-sectional side views of metal enclosure 15 at different stages in the method of FIG. 10, in an embodiment where step 40 is conducted prior to step 20. In the embodiment illustrated in FIG. 11, in step 10, metal enclosure 15 has surfaces 16 and 18 which are joined by corner 19 which is chamfered and has a surface 12. In anodizing step 40 illustrated in FIG. 12, surfaces 16 and 18 are anodized to form respective anodized layers 45 and 47. In cladding step 20 illustrated in FIG. 13, surface 12 of chamfered corner 19 is laser clad with cladding layer 35. Anodized layer 45 extends to meet cladding layer 35 at edge 11 of chamfered corner 19. Anodized layer 47 extends to meet cladding layer 35 at edge 13 of chamfered corner 19. In step 50 illustrated in FIG. 14, a finishing process is conducted on layers 45, 47 and/or 35. For example, anodized layers 45 and/or 47 can be dyed and/or sealed, and can further be provided with a polished or blasted finish. Cladding layer 35 can be provided with a polished or blasted finish, for example. In the embodiment illustrated, after step 20, anodized layers 45 and 47 extend higher than cladding layer 35 at edges 11 and 13. In such embodiments, the finishing process for anodized layers 45 and 47 can include removal of excess metal oxide so that anodized layers 45 and 47 are substantially flush with cladding layer 35 where these layers touch at edges 11 and 13. As result of treating metal enclosure 15 with the laser cladding and anodized processes as described herein, chamfered corner 19, which may be difficult to anodize, can instead be clad with cladding layer 35. Moreover, cladding layer 35 can have properties which provide improved structural and/or cosmetic properties compared to the underlying metal substrate. For example, cladding layer 35 can have a higher corrosion resistance than the underlying metal substrate. The composition of cladding layer 35 may be selected to provide improved hardness and/or fracture toughness. For example, cladding layer 35 may be configured to have a fracture toughness sufficient to withstand the expected impact forces and/or abrasions that corner 19 may be exposed to during use of metal enclosure 15. FIGS. 11-14 are merely exemplary and provided for explanatory purposes of the methods described herein, and other variations of treating metal enclosure 15, to include cladded and anodized regions should be apparent to one of skill in the art.

Figure 15:
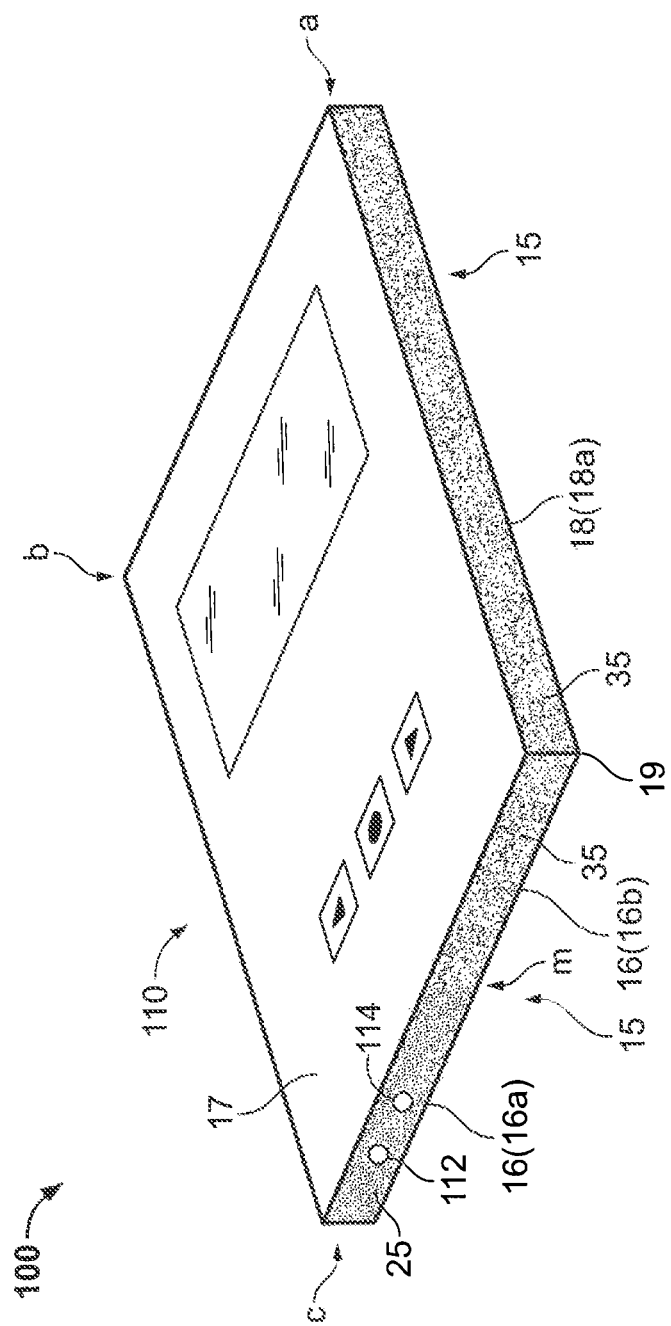
FIG. 15 is a perspective view of an exemplary electronic device having a metal enclosure made according to an embodiment of a method of the present application.

Applications of metal enclosures produced according to the methods described herein can include any product having an enclosure made of metal. In some embodiments, the product is an electronic device (e.g., a PC computer, tablet, cell phone, MP3 player, scanner), and metal enclosure 15 forms all or part of the housing of the electronic device. FIG. 15 illustrates a perspective view of an exemplary MP3 player device 100 according to one embodiment of the present application. Device 100 has a housing 110, which includes opposite front and rear walls 17 (rear wall hidden from the view illustrated) joined together by metal enclosure 15 extending around the periphery of front and rear walls 17. Metal enclosure 15 has top and bottom exterior surfaces 16 (top surface hidden from the view illustrated), and left and right side exterior surfaces 18 (left side surface hidden from the view illustrated). Bottom surface 16 of metal enclosure 15 includes adjacent surface regions 16a and 16b that meet at a point m. Surface region 16a is laser clad with cladding layer 25, and surface region 16b is laser clad with cladding layer 35. Connector ports 112 and 114 (e.g., for receiving audio and power jacks) are formed in surface region 16a of bottom surface 16. Side surface 18 including surface region 18a is also laser clad with cladding layer 35. Thus, cladding layer 35 coats corner 19 of metal enclosure 15. The other exterior surfaces 16 and 18 (hidden from the view illustrated) can likewise be laser clad with one or more cladding layers at localized surface regions. For example, cladding layer 35 can also be deposited to coat the other three corners at points a, b, c of metal enclosure 15. Interior surfaces of metal enclosure 15 can also be laser-clad with one or more cladding layers (e.g., cladding layers 25 and/or 35). In some embodiments, front and rear walls 17 can be metal, and all or part of the surfaces of walls 17 can be laser clad, anodized, and/or provided with another metal surface treatment.

In some embodiments, surface region 16a may have a higher likelihood of receiving scratches or abrasions during use of device 100 than surface regions 16b and 18a (e.g., surface region 16a may be scratched by audio and power jacks attaching to connector ports 112 and 114). Corner 19 may have a higher likelihood than surface region 16a of receiving greater impact forces if a user drops device 100. In such instances, it may be desirable for cladding layer 35 to have a greater fracture toughness than that of cladding layer 25, and for cladding layer 25 to have a greater hardness than that of cladding layer 35.

The foregoing description of the specific embodiments will so fully reveal the general nature of the invention that others can, by applying knowledge within the skill of the art, readily modify and/or adapt for various applications such specific embodiments, without undue experimentation, and without departing from the general concept of the present invention. Therefore, such adaptations and modifications are intended to be within the meaning and range of equivalents of the disclosed embodiments, based on the teaching and guidance presented herein.

It is to be understood that the phraseology or terminology herein is for the purpose of description and not of limitation, such that the terminology or phraseology of the present specification is to be interpreted by the skilled artisan in light of the teachings and guidance. In addition, the breadth and scope of the present invention should not be limited by any of the above-described exemplary embodiments, but should be defined only in accordance with the following claims and their equivalents.

What is claimed:

1. A housing for an electronic device, the housing configured to house internal components of the electronic device therein, the housing comprising:
    a metal substrate having first, second, and third surface regions, wherein the second and third surface regions converge at a corner;
    a first metal coating fused to the first surface region at a first heat affected zone, the first metal coating characterized as having a first concentration of ceramic particles suspended in a metal matrix; and
    a second metal coating fused to the second and third surface regions and the corner at a second heat affected zone, the second metal coating characterized as having a second concentration of the ceramic particles suspended in the metal matrix, wherein the second concentration is lower than the first concentration such that the second metal coating has a greater fracture resistance than the first metal coating.

2. The housing of claim 1, wherein the first metal coating has a greater hardness than the second metal coating.

3. The housing of claim 1, wherein the metal matrix includes stainless steel or another steel alloy.

4. The housing of claim 1, wherein the ceramic particles include at least one of titanium carbide or tungsten carbide.

5. The housing of claim 1, wherein the metal matrix and the metal substrate are a same metal.

6. The housing of claim 1, wherein the metal matrix includes at least one of aluminum, steel, nickel, cobalt, magnesium, titanium, or alloys thereof.

7. The housing of claim 1, wherein the first and second metal coatings are adjacent to an anodized layer on the metal substrate.

8. The housing of claim 1, wherein the first metal coating has a greater abrasion resistance than the second metal coating.

9. The housing of claim 1, wherein the first and second metal coatings have different thicknesses.

10. The housing of claim 1, wherein the ceramic particles of the first metal coating include a different ceramic material than the ceramic particles of the second metal coating.

11. The housing of claim 1, wherein at least one of the first, second or third surface regions of the metal substrate has a blasted surface texture.

12. The housing of claim 1, wherein at least one of the first metal coating or the second metal coating has a polished surface.

13. A housing for an electronic device, the housing comprising:
    a metal substrate having first, second, and third surface regions, wherein the second and third surface regions converge at a corner; and a coating that includes:
- a first metal layer fused to the first surface region at a first heat affected zone and having a first concentration of ceramic particles suspended in a metal matrix; and
- a second metal layer fused to the second and third surface regions and the corner at a second heat affected zone, wherein the second metal layer has a second concentration of ceramic particles suspended in the metal matrix, and the second concentration is greater than the first concentration such that the second metal layer has a greater hardness than the first metal layer.

14. The housing of claim 13, wherein the metal matrix and the metal substrate include a same metal.

15. The housing of claim 13, wherein the metal matrix includes at least one of aluminum, steel, nickel, cobalt, magnesium, titanium or alloys thereof.

16. The housing of claim 13, wherein the ceramic particles within the first and second metal layers include the same ceramic material.

17. The housing of claim 13, wherein the first and second metal layers have different thicknesses.

18. The housing of claim 13, wherein the ceramic particles within the first metal layer include a different ceramic material than the ceramic particles within the second metal layer.

19. A housing for an electronic device, the housing comprising:
- a metal substrate having first, second, and third surface regions, wherein the second and third surface regions converge at a corner; and
- a metal coating covering the metal substrate and having ceramic particles within a metal matrix, the metal coating having:
  - a first portion fused to the first surface region at a first heat affected zone, the first portion having a first concentration of ceramic particles; and
  - a second portion fused to the second and third surface regions and the corner at a second heat affected zone, the second portion having a second concentration of the ceramic particles that is less than the first concentration such that the second portion has a corrosion resistance that is different from the first portion.

20. The housing of claim 19, wherein the metal matrix includes at least one of aluminum, steel, nickel, cobalt, magnesium, titanium, or alloys thereof.

* * * * *